US005467065A

United States Patent [19]

Turunen et al.

[11] Patent Number: 5,467,065

[45] Date of Patent: Nov. 14, 1995

[54] FILTER HAVING RESONATORS COUPLED BY A SAW FILTER AND A DUPLEX FILTER FORMED THEREFROM

[75] Inventors: Aimo Turunen; Heli Jantunen, both of Oulu, Finland

[73] Assignee: LK-Products Oy, Kempele, Finland

[21] Appl. No.: 202,901

[22] Filed: Feb. 28, 1994

[30] Foreign Application Priority Data

Mar. 3, 1993 [FI] Finland .................................... 930944

[51] Int. Cl.[6] .............................. H03H 7/46; H01P 1/213

[52] U.S. Cl. .......................... 333/132; 333/133; 333/193; 333/202; 370/38; 370/123

[58] Field of Search .................................... 333/126, 129, 333/132–135, 193, 202; 370/38, 123

[56] References Cited

U.S. PATENT DOCUMENTS

| | | | |
|---|---|---|---|
| 4,509,165 | 4/1985 | Tamura | 370/38 |
| 4,694,266 | 9/1987 | Wrightt | 333/196 |
| 5,077,545 | 12/1991 | Gopani et al. | 333/195 |
| 5,254,962 | 10/1993 | Morris et al. | 333/202 X |

FOREIGN PATENT DOCUMENTS

| | | | |
|---|---|---|---|
| 0269064 | 11/1987 | European Pat. Off. | H03H 9/64 |
| 0316836 | 11/1988 | European Pat. Off. | H03H 9/64 |
| 0337703 | 4/1989 | European Pat. Off. | H03H 9/64 |
| 211701 | 8/1990 | Japan | 333/133 |
| 9201333 | 1/1992 | WIPO | 333/132 |

OTHER PUBLICATIONS

J. Vandewege et al., "Acoustic Surface Wave Resonators for Broadband Applications", 8th European Microwave Conference–Proceedings, Sep. 4–8, 1978, pp. 663–667.

K. Anemogiannis et al., "Saw Microstrip Front–End for Mobile Communication Systems in the GHZ Range", 1991 IEEE MTT–S International Microwave Symposium Digest, vol. III, Jun. 10–14, 1991, pp. 973–976.

Patent Abstracts of Japan, vol. 9, No. 53 (E–301) 7 Mar. 1985 & JP–A–59 194 501 (Matsushita Denki Sangyo K.K.) 5 Nov. 1984, 1 page.

W. Schwab et al., "A Low–Noise Active Bandpass Filter", IEEE Microwave and Guided Wave Letters, vol. 3, No. 1, Jan. 1993, pp. 1–2.

*Primary Examiner*—Benny Lee

*Attorney, Agent, or Firm*—Darby & Darby

[57] ABSTRACT

A filter, particularly suitable for radio frequency applications comprises a first filter which, in turn, comprises at least a pair of intercoupled resonators (RES1, RES2), and a SAW filter (SAW) which is coupled between the two intercoupled resonators so that a signal input to the filter at its input (IN) is coupled through the SAW filter to provide an output signal at its output (OUT). This provides a filter with all the advantages of a SAW filter, but with the ability to withstand the high power requirements of radio frequency applications. If three or more resonators are present in the first filter, then an amplifier can also be integrated in the filter. The SAW filter (and the amplifier if present) are inductively or capacitively coupled to the resonators depending upon the type of filter that is required.

6 Claims, 2 Drawing Sheets

PRIOR ART

FILTER HAVING RESONATORS COUPLED BY A SAW FILTER AND A DUPLEX FILTER FORMED THEREFROM

The present invention relates to a filter for providing an output signal at its output from an input signal input thereto, the output signal having a frequency in a predetermined frequency range, and the filter comprising a first filter comprising at least a pair of intercoupled resonators, and a SAW filter. The invention also relates to a radio transceiver incorporating such a filter.

BACKGROUND OF THE INVENTION

Generally speaking, a radio transmitter-receiver (transceiver), for example, as in a radio telephone requires a duplex filter when the same antenna is used for both transmission and reception. It is well known to persons skilled in the art to employ duplex filters, comprising resonators, in radio transceivers to prevent the transmission signal from travelling into the receiver and, likewise, the received signal from travelling into the transmitter. A duplex filter usually consists of two separate bandpass filters, one of which is connected to the receiver section of the transceiver, the mean frequency and bandwidth thereof corresponding to the reception frequency band, and the other filter being connected to the transmitter section of the transceiver, the mean frequency and bandwidth thereof being equivalent to the transmission frequency band. The other ends of the filters are frequently connected to a common antenna line via a transmission line that matches the impedance of the common antenna line.

Duplex filter designs are commercially available for a plurality of different transceiver circuit designs and are usually composed of helical filters, dielectric filters, or the like. As the size and price of radio telephones goes down, there is a need to provide, not only smaller and less expensive circuit elements, such as semiconductors, but also to implement smaller and less expensive duplex filters. The helical and dielectric filters take up most of the space within a radio transceiver although attempts have been made to make them more and more compact.

In radio telephone technology, filters based on surface acoustic wave resonators have been in use for some time. These are often called surface acoustic wave or SAW filters. An advantage of these SAW filters is not only their small size but also the precision with which they can be reproduced in manufacture. The part of the component accommodating the surface wave phenomenon, in itself, is an interdigital converter, consisting of interdigital electrodes arranged in comb-like fashion on a piezoelectric substrate. An electrical voltage between the electrodes generates acoustic waves in the substrate, propagating on the surface thereof, in a direction perpendicular to the interdigital comb electrodes. These surface acoustic waves can be detected by an interdigital converter which converts the acoustic surface waves propagating on the surface of the substrate back into an electrical voltage. In comparison with electromagnetic waves, the propagation velocity of an acoustic surface wave on a piezoelectric substrate is slower by about 1/100,000 times. Using surface acoustic wave technology, many circuits, such as filters, delay lines, resonators, oscillators, etc. can be produced, for example, such as a notch filter disclosed in US patent U.S. Pat. No. 4,694,266.

However, the use of SAW filters in duplex filters does involve certain problems. A received signal at the reception frequency entering the receiver through the reception branch of a duplex filter, is required to withstand high levels of power, since, for example, in a cellular radio telephone system the maximum output power of a base station is of the order 2 to 300 W. Respectively, the maximum output power of a conventional radio telephone is of the order 2 to 20 W, and the standard output power range varies from a few hundreds of milliWatts to several Watts. At these power levels the SAW filter becomes overheated and burns, as it withstands voltages poorly, this being due to its small-sized electrode structure. Commercially available SAW filters are typically bandpass filters with a low attenuation capacity in the proximity of the mean frequency, though it will grow rapidly outside the pass band. The stop band attenuation of the SAW filter, being of the order 20 dB, is insufficient for a duplex filter. For example, in ceramic filters the attenuation of the stop band is of the order 30 dB. The attenuation of the pass band in a SAW filter (which is about 3–4 dB) suffices, although it is worse than for example, in ceramic filters (which is about 2 dB).

U.S. Pat. No. 4,509,165 describes a duplex filter comprising SAW resonators and is described below with reference to FIG. 1. FIG. 1 is a schematic block diagram of part of a radio telephone having a common antenna 1 for both transmitting and receiving signals. The receiver branch of a duplex filter is a bandpass filter 2 which is coupled, in the receiver section of the transceiver to the antenna 1 to receive signals therefrom. The transmitter section (TX) of the transceiver is also coupled to the antenna 1 via a transmitter branch of the duplex filter (not shown) for coupling a transmission signal thereto. This bandpass filter 2 comprises a dielectric or helical filter 3 (which is a bandpass filter) coupled to the antenna 1 at one end and, at its other end, to a SAW filter 4. By providing a dielectric or helical filter 3 at the antenna end to receive the power from the antenna 1, attempts have been made to avoid the breaking down of the SAW filter 4 caused by far too high a voltage. In U.S. Pat. No. 4,509,165 a method of connecting the SAW filter 4 in series with the bandpass filter 3 is disclosed. Normally, the resistivity of a commercially available SAW filter is 200 ohms, and since in the systems in which filters are in use, the impedance is usually 50 ohms, the SAW filter has to be matched to 50 ohms. By means of the coupling disclosed in U.S. Pat. No. 4,509,165, the need of matching circuits can be minimized, but in such instances the performance, i.e., the attenuation of the pass band and the stop band is not as good as is possible. For a higher performance, the first end of the filter 2, i.e., the dielectric or helical filter 3 and the SAW filter 4 should be coupled separately, which means more components are necessary in the filter 2, which also means an increases in the size of the filter. Another problem with this design is that the attenuations of the pass band of the series-connected SAW filter 4 and the dielectric/helical filter 3 are summed, and, as a result, the attenuation of the pass band increases.

As is well known to persons skilled in the art, filters having the desired properties can be realised by the appropriate interconnection of a number of resonators. The resonators are in the form of a transmission line resonator corresponding to the parallel connection of an inductance and a capacitance. It is also well known in the art in high frequency technology to use different types of resonators for different applications according to the conditions and the desired properties. Known resonator types include dielectric, helical, strip line and air-insulated rod resonators each having a relevant range of a uses. For example, dielectric resonators and filters constructed therefrom are commonly used in high frequency technology and are useful in a number of applications because of their small size and weight, stability and power resistance. For instance, a dielectric filter, for use in a duplex filter, can be constructed from separate ceramic blocks or from one block provided with a number of resonators in which the coupling therebetween is accomplished electromagnetically within the ceramic material. A dielectric stop band filter is usually composed of separate blocks, with coupling between the resonators via the dielectric material being prevented completely. A filter described above and used in the first end of the duplex filter may equally be constructed from helical, strip line or coaxial resonators. All of these are filter designs well known to a person skilled in the art, and therefore, they are not described herein any further detail except as is relevant to the present invention.

FIG. 2 is a schematic circuit diagram of a stop filter having two resonators RES1, RES2. To each resonator RES1 and RES2, a capacitance C1, C2 respectively, is coupled galvanically in an appropriate point A,B. The coupling point A,B determines the impedance level of the resonator, and by selecting the coupling point A,B appropriately, the resonator can be matched into the circuit. This coupling, wherein the coupling point A,B, forms a tap output from the resonators RES1, RES2 respectively is called tapping, and the coupling point A,B, the tapping point. When using helical resonators, they are also coupled by tapping, whereby, for example, a connection line is soldered to a given point in the helical resonator coil, usually in the first round of the coil. A filter is realised by coupling the resonators RES1, RES2 together. This coupling can be accomplished either capacitively or inductively according to what kind of filter is desired. By coupling the resonators together inductively L, as shown in FIG. 2, a bandstop filter is produced (in this case a high-pass filter). By replacing the capacitances C1,C2 with transmission lines, a low-pass filter is produced, and furthermore, by coupling the resonators RES1, RES2 together capacitively at the upper ends, a bandpass filter is produced. The input IN and output OUT of the filter is provided in the example in FIG. 2 at the other ends of the capacitances C1,C2 from those ends coupled to the resonators RES1,RES2.

SUMMARY OF THE INVENTION

According to an aspect of the present invention there is provided a filter in which the SAW filter is coupled between the at least one pair of resonators to provide the intercoupling such that the input signal is coupled to the output through the SAW filter to provide the output signal. This has the advantage of providing a filter in which the weaknesses of an individual SAW filter are avoided with regard to the ability to withstand power, and its stop band attenuation, while also utilizing the small size of the SAW filter to provide a small sized filter, which has the properties of a dielectric or helical filter, or any other equivalent filter. The intercoupling of the two resonators by means of a SAW filter enables the filter to withstand more power, and because the SAW filter is integrated, although it must still be matched to the impedance of the system there are savings in the number of components because there is no need to match separately the SAW filter. Thus, the production costs of the filter are reduced, and thanks to the small size of the SAW filter, the entire filter structure can be made small.

A filter in accordance with the invention can be incorporated in a duplex filter for use, for example, in a radio transceiver as used in a radio telephone, thus allowing all the advantages of smaller size and reduced production costs to apply to the transceiver as well.

BRIEF DESCRIPTION OF THE DRAWINGS

The invention will now be described, by way of example only, with reference to the accompanying figures, of which.

DETAILED DESCRIPTION OF THE PREFERRED EMBODIMENT

Figure 1:
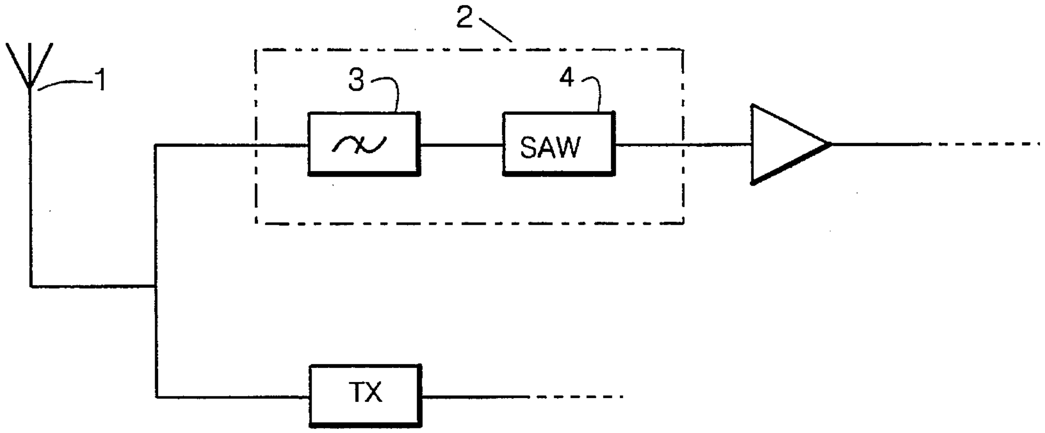
Fig. 1 PRIOR ART
FIG. 1 is a schematic block diagram of a conventional part of a radio telephone incorporating a prior art SAW filter in a duplex filter.
Figure 2:
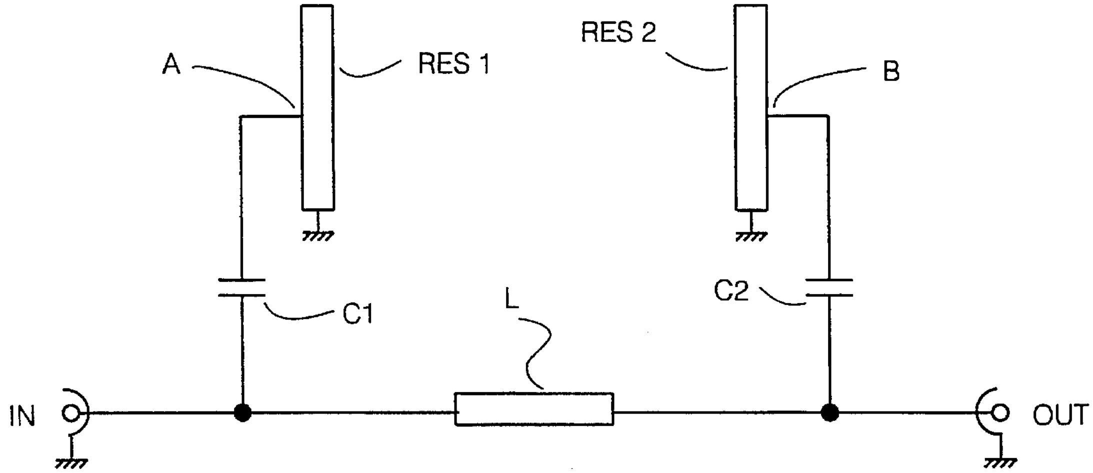
FIG. 2 is a schematic circuit diagram of a conventional highpass filter constructed of resonators.

FIGS. 1 and 2 have already been described with reference to the prior art.

Figure 3:
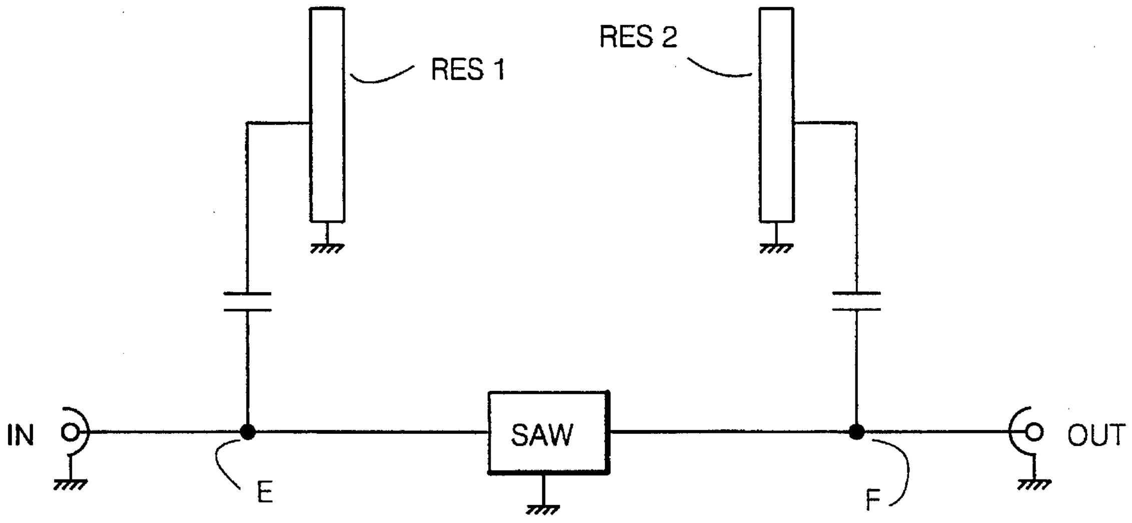
FIG. 3 is a schematic circuit diagram of a radio frequency filter in accordance with the invention.

FIG. 3 illustrates schematically a stop band filter serving as an highpass filter. The filter is identical in most respects to the filter shown in FIG. 2, except that a SAW filter has been placed in the coupling path between the two resonators RES1 and RES2, whereby the coupling of the resonators RES1,RES2 is achieved with the SAW filter instead of the inductance L of FIG. 2. At the resonant frequency of the resonators RES1 and RES2, the filter acts as a stop band filter passing the higher frequencies. The filter design can therefore be used, for example, in the reception branch of a duplex filter in a radio transceiver of the type described above with reference to FIG. 1, in which the reception frequency band is located above the transmission frequency band. Hereby, the resonators RES1, RES2 present high impedances at the transmission frequencies at points E and F of FIG. 3, while at the reception frequencies, the signal passes from the input IN through the SAW filter to the output OUT. In this way, the SAW filter is no longer a separate component, but integrated into the filter itself.

Figure 4:
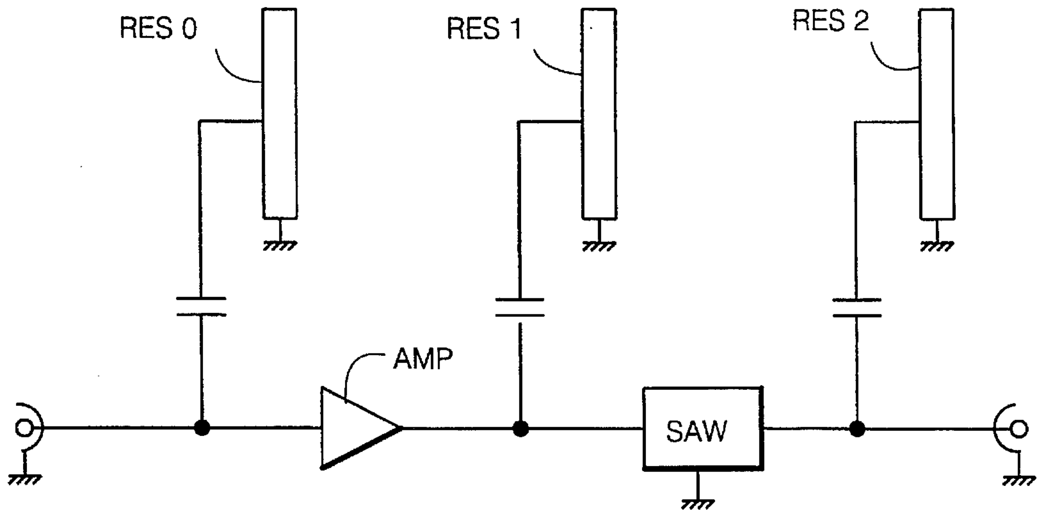
FIG. 4 is a schematic circuit diagram of a second embodiment of the invention.

If the filter is composed of more than two resonators, as for example, illustrated in FIG. 4, then the coupling between each pair of adjacent resonators RES0, RES1, RES2 can be substituted with a SAW filter, or, alternatively, a SAW filter can only be inserted between certain resonators. Additionally, an amplifier could be coupled between another pair of resonators, to provide an amplified and filtered output signal. For example, in FIG. 4, a SAW filter is coupled between the second and the third resonators RES1 and RES2 respectively, and for example, the amplifier AMP is coupled between the first and second resonators RES0 and RES1 respectively. The insertion of an amplifier AMP between two resonators in a filter are disclosed and discussed in the applicants copending Finnish Patent Application Number 930945. By means of the filter and amplifier combination shown in FIG. 4 a good front end of the radio receiver can be obtained.

FIGS. 3 and 4 show that to each resonator (RES 1 and RES 2 of FIG. 3, RES 0, RES 1 and RES2 2 of FIG. 3), a respective capacitance is coupled galvanically; such galvanic coupling is of the same type as for the resonators RES 1 and RES 2 of FIG. 2 with respect to the respective capacitors C1 and C2.

It will be understood to a person skilled in the art that various modifications are possible within the scope of the present invention. For example, the SAW filter (and amplifier if present) can be inductively coupled, rather than capacitively coupled, to the resonators to provide a low pass filter, as may be required by the application.

We claim:

1. A filter having an input and an output for providing an output signal at the output from an input signal applied at the input, the output signal having a frequency in a frequency range, the filter comprising:

a first filter comprising at least a pair of intercoupled resonators; and a SAW filter coupled between the pair of intercoupled resonators to provide intercoupling therebetween, whereby the input is coupled to the output through the SAW filter to provide the output signal.

2. A filter as claimed in claim 1 characterised in that the SAW filter is capacitively coupled to each of the pair of resonators.

3. A filter as claimed in claim 1, characterised in that the SAW filter is inductively coupled to each of the resonators of the pair of resonators.

4. A filter having an input and an output, the filter providing an output signal at the output from an input signal input at the applied, the output signal having a frequency in a predetermined frequency range, the filter comprising:

first, second and third resonators;

a SAW filter coupled between the second and third resonators; and an amplifier coupled between the first and second resonators, and also coupled to the SAW filter, such that the input signal is coupled to the output through the amplifier and the SAW filter to provide an amplified output signal.

5. A radio transceiver comprising:

an antenna;

a receiver section;

a transmitter section; and a duplex filter coupling the antenna to both the receiver and transmitter sections, the duplex filter comprising a receiver branch filter with an output coupled to the receiver section and with an input coupled to the antenna for filtering a received signal coupled from the antenna, and a transmitter branch filter with an input coupled to the transmitter section and with an output coupled the antenna for filtering a signal coupled from the transmitter section to the antenna, at least one of the receiver branch filter and transmitter branch filter respectively comprising at least one filter, the at least one filter comprising:

a first filter comprising at least a pair of intercoupled resonators; and a SAW filter coupled between the pair of intercoupled resonators to provide the intercoupling, whereby the input is coupled to the output through the SAW filter to provide the output signal.

6. A radio transceiver as claimed in claim 5 wherein the one filter is in the receiver branch of the duplex filter.

* * * * *